(12) United States Patent
Dolman et al.

(10) Patent No.: US 6,678,506 B1
(45) Date of Patent: Jan. 13, 2004

(54) EXTENDED RANGE POWER DETECTOR

(75) Inventors: Graham Dolman, Saffron Walden (GB); Scott Widdowson, Harlow (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/480,510

(22) Filed: Jan. 10, 2000

(30) Foreign Application Priority Data

Jan. 13, 1999 (GB) ............................................. 9900612

(51) Int. Cl.⁷ .............................. H04Q 7/30; H04Q 7/32
(52) U.S. Cl. ...................... 455/127; 455/126; 455/115; 455/116; 330/51; 330/124 R; 330/129; 330/140
(58) Field of Search ................................ 455/126, 127, 455/115, 116, 550, 423, 424, 425; 330/51, 124 R, 129, 140

(56) References Cited

U.S. PATENT DOCUMENTS

| | | | |
|---|---|---|---|
| 4,490,681 A | | 12/1984 | Turner ......................... 329/179 |
| 4,760,347 A | * | 7/1988 | Li et al. ...................... 330/127 |
| 5,204,637 A | * | 4/1993 | Trinh ........................... 330/129 |
| 6,094,585 A | * | 7/2000 | Dajer et al. .................. 455/127 |
| 6,108,527 A | * | 8/2000 | Urban et al. ................. 455/115 |
| 2001/0034217 A1 | * | 10/2001 | Loke et al. .................. 455/126 |

* cited by examiner

*Primary Examiner*—William Trost
*Assistant Examiner*—Keith Ferguson
(74) *Attorney, Agent, or Firm*—Barnes & Thornburg (57) ABSTRACT

This invention relates to power detectors as employed in electrical circuits in general. The invention also relates to power detectors associated with high power amplifiers and, in particular, but not exclusively, relates to power detectors associated with telecommunications high power and high frequency power amplifiers. The present invention further provides apparatus and methods of switching amplifier blocks. The present invention seeks to provide an improved power detector having an increased range. In accordance with a first aspect of the invention, there is provided a radio frequency power detector, which detector comprises a radio frequency coupler, a radio frequency to direct current voltage converter and an operational amplifier circuit to provide voltage scaling; wherein the operational amplifier circuit includes a plurality of amplifiers operable to amplify the dc signals. The amplifiers can be switched into operation under microprocessor control or by diode switching. In accordance with a second aspect of the invention, there is provided a method of operating this radio frequency power detector.

16 Claims, 9 Drawing Sheets

| Parameter | Specification | | | |
|---|---|---|---|---|
| COUPLER | Min | Typ | Max | Units |
| frequency range | 1800 | | 1880 | MHz |
| insertion loss (excl. feeder track) | | 0.2 | 0.35 | dB |
| coupling | 29.5 | 30 | 30.5 | dB |
| directivity | 20 | | | dB |
| input / output 1,2 Z | | 50 | | Ohm |
| input / output 1,2 return loss | 20 | | | dB |

| Parameter | Specification | | | |
|---|---|---|---|---|
| POWER DETECTOR | Min | Typ | Max | Units |
| frequency range | 1800 | | 1880 | MHz |
| type | | peak | | |
| accuracy (steady state) [b] over temperature and frequency | -0.5 | | +0.5 | dB |
| attack settling time to reach [b] | | | 50 | µs |
| decay settling time to reach [b] | | | 50 | µs |
| rms power range | -16.25 | | 17.85 | dBm |
| output voltage range | 0 | | 5 | V |
| transfer characteristic | +ve continuous monotonic | | | |

Fig.11

|  | Frequency (MHz) | | |
| --- | --- | --- | --- |
|  | 1800 | 1850 | 1900 |
| Insertion Loss (dB) | -0.12 | -0.12 | -0.13 |
| Coupled Power (dB) | -33.2 | -33.7 | -33.4 |
| Directivity (dB) | -26.5 | -23.9 | -23.3 |
| IS11I (dB) | 25.9 | 25.0 | 24.9 |

*Fig.12*

|  | Frequency (MHz) | | |
| --- | --- | --- | --- |
|  | 1800 | 1850 | 1900 |
| IS11I (dB) 2gpa023(003) | 17 | 25 | 25 |
| IS11I (dB) 2gpa023(004) | 16 | 21 | 20 |
| IS11I (dB) 2gpa023(005) | 12 | 12.5 | 12.6 |

*Fig.13*

|  | Simulated | | Measured | |
| --- | --- | --- | --- | --- |
|  | Min | Max | Min | Max |
| Coupler |  |  |  |  |
| frequency range (GHz) | 1.8 | 1.9 | 1.8 | 1.9 |
| Insertion Loss (dB) | 0.056 | 0.087 | 0.12 | 0.13 |
| Coupling (dB) | 32 | 30 | 33.2 | 33.7 |
| Directivity (dB) | 13 | 27 | 23.3 | 26.5 |
| Impedance |  |  |  |  |
| Return Loss (dB) | 22 |  | 24.9 | 25.9 |
|  |  |  |  |  |
| Power Detector |  |  |  |  |
| frequency range (GHz) | 1.8 | 1.9 | 1.8 | 1.9 |
| IS11I (dB) | 33 | 39 | 17 | 25 |
| Accuracy (T,f) (dB) |  |  |  |  |
| Attack Settling time (µs) |  |  |  |  |
| Decay Settling time (µs) |  |  |  |  |
| Power range (dBm) |  |  | -20 | 16 |
| Output voltage range (V) |  |  | 1 | 4 |
| Transfer characteristic | +ve continuous monotonic | | +ve continuous monotonic | |

*Fig.14*

|  | Specified | | Measured | | Compliant |
| --- | --- | --- | --- | --- | --- |
|  | Min | Max | Min | Max |  |
| Coupler | | | | | |
| frequency range (GHz) | 1.8 | 1.9 | | | Yes |
| Insertion Loss (dB) | | 0.35 | | 0.13 | Yes |
| Coupling (dB) | 29.5 | 30.5 | 33.2 | 33.7 | Yes[1] |
| Directivity (dB) | 20 | | 23.3 | 26.5 | Yes |
| Impedance | 50Ω | 50Ω | | | By design |
| Return Loss (dB) | 20 | | 24.9 | 25.9 | Yes |
| Power Detector | | | | | |
| frequency range | 1.8 | 1.9 | | | Yes |
| Accuracy (T,f) (dB) | | ± 0.5 | | | Yes[2] |
| Attack Settling time (μs) | | 50 | | | Not measured |
| Decay Settling time (μs) | | 50 | | | Not measured |
| Power range (dBm) | -16.25 | +17.85 | -20 | 16 | Yes[3] |
| Output voltage range (V) | 0 | 5 | 1 | 4 | No[4] |
| Transfer characteristic | +ve continuous monotonic | | +ve continuous monotonic | | Yes |

[1] The measured results included a Wilkinson splitter.

[2] Above 0dBm input power, assuming that effect of frequency is constant with temperature, and neglecting supply voltage variation

[3] +17.85 dBm not possible with test equipment used. Circuit is capable of operating at +17.85 dBm, although resistor values may require change.

[4] Op-amp range is limited to 0 to 3.5V. Circuit maximum output voltage of 4V made possible by diode in op-amp feedback loop, but this gives a minimum voltage of IV.

*Fig.15*

EXTENDED RANGE POWER DETECTOR

FIELD OF THE INVENTION

This invention relates to power detectors as employed in electrical circuits in general. The invention also relates to power detectors associated with high power amplifiers and, in particular, but not exclusively, relates to power detectors associated with telecommunications high power and high frequency power amplifiers. The invention also relates to switching amplifier/attenuator blocks.

BACKGROUND TO THE INVENTION

It is a problem in the field of electrical circuits and amplifiers in general, and, in particular, transmit power amplifiers to precisely and dynamically control the operation of the amplifying elements that comprise the amplifier. In the case of cellular radio transmit amplifiers, the effective radiated power must be within statutory limits.

Signal level detectors often employ a diode envelope detector type of circuit. Such diode circuits are characterized by a limited dynamic range of input signals in which they can work, and they are highly sensitive to temperature variations. Many detector applications require a high degree of operating precision over a large signal range and over a wide temperature range necessitating complex and expensive measures to cope with the problems of temperature sensitivity and limited dynamic range of operation.

Schottky type diodes are often employed in such diode envelope detectors. These detector circuits are often divided according to two different types of operation. One is a low input signal, or square-law, detector in which the output voltage is a function of the square of the input voltage, or a function of the input power. Another type is the large signal, or linear-law, detector in which the output voltage is a function of the input voltage. The diode sensitivity to temperature variations is most severely evidenced in the square-law region of operation. It is known that diode detector circuits can be modified in order to alter either or both of the temperature sensitivity and the range of operation. In some cases, the circuit modifications must themselves be changed when the range of operation of the detector is to be altered. Consequently, envelope detectors which must operate under severe temperature conditions and over a large dynamic range of input signals, become quite complex and expensive.

For high power applications a detector having over 30 dB of range is increasingly often being required. The detector should be very stable with temperature, especially over the top 16 dB or so of range. Such a range from a simple low cost circuit is not easy to realize, as a diode response over this range is logarithmic.

A standard approach can give up to 28 dB range, with good temperature cancellation for the bottom part of the range, degrading as input power is increased. It is possible to force the current in a temperature sensing diode to equal that in the power detecting diode using feedback. This approach results in a complex circuit, which may not necessarily have the required range.

The required range could be achieved by using two separate operational amplifier circuits, one with high gain for the low part of the range, and one with low gain for the high part of the range. A separate circuit can then be used to switch between the two ranges, increasing system complexity. This would also require some form of hysteresis.

Another method would be to follow the diode detector with a 'log amplifier', which linearizes the response. Whilst this is a feasible solution it may have its complications. A super-matched pair of transistors would almost certainly be necessary to ensure temperature stability of the log amp circuit, increasing cost and complexity. Further, some form of temperature compensation for the detector diode would also be necessary.

U.S. Pat. No. 4,490,691 (Turner) provides a signal level detector employing diode circuits which are arranged to extend the continuous input signal range over which the detector can operate without user intervention to modify the detector circuits. The detector has both square-law and linear-law ranges of operation, and is provided with circuits for extending the linear-law range of its operation for effectively overlapping at least a part of a variable-law transition range which is between the linear-law and square-law ranges.

OBJECT TO THE INVENTION

The present invention seeks to provide an improved power detector having an increased range. The present invention further seeks to provide an power detector having a range of over 30 dB. The present invention further seeks to provide a radio frequency power detector which is of a simple construction which lends itself to simple and cheap mass production techniques.

SUMMARY OF THE INVENTION

In accordance with a first aspect of the invention, there is provided a radio frequency power detector, which detector comprises a radio frequency coupler, a radio frequency to direct current voltage converter and an operational amplifier circuit to provide voltage scaling; wherein the operational amplifier circuit includes a plurality of amplifiers operable to scale the dc signals, and wherein the plurality of amplifiers are sequentially independently operable over particular ranges, whereby the full range of operation of the detector is determined by the discrete ranges of operation of the plurality of amplifiers.

Preferably the amplifiers are switched into operation by means of diodes which are brought into operation depending upon the gain and offset voltages for the respective amplifiers within the amplification circuitry. Whereby the diodes in the operational amplifier feed back loops automatically transfer from the one operating range to another dependent upon the input signal voltage. The switching operation of the amplifiers is similar to a wired OR connection used in digital electronics in that amplifiers U1 or U2 are switched.

Alternatively the amplifiers are switched into operation under microprocessor control or similar: when the output reaches a certain value then the circuit could be switched to a different amplifier. This switching system may result in an output curve having a hysteresis response in the transition region between the operating ranges of the two amplifiers.

Preferably, the radio frequency to direct current voltage converter is a Schottky diode detector. Preferably, the radio frequency to direct current voltage converter is a diode detector. Preferably, the diode detector has an additional diode to cancel the voltage drop occurring through the diode and to provide temperature tracking.

In accordance with a second aspect of the invention, there is provided a method of operating a radio frequency power detector, which detector comprises a radio frequency coupler, a radio frequency to direct current voltage converter and an operational amplifier circuit to provide voltage scaling; wherein the operational amplifier circuit includes a plurality of amplifiers operable to amplify the dc signals, and wherein the plurality of amplifiers are sequentially independently operable over particular ranges, whereby the full range of operation of the detector is determined by the discrete ranges of operation of the plurality of amplifiers, the method comprising the steps of coupling rf energy, converting the rf energy to direct current voltage and outputting a signal of voltage Vrf to an amplification circuit, and operating the amplifier appropriate for the particular level of voltage.

Preferably, the amplifiers are switched into operation by means of diodes which are brought into operation depending upon the gain and offset voltages for the respective amplifiers within the amplification circuitry. In the alternative, microprocessor control may be employed.

In accordance with a third aspect of the invention, there is provided a telecommunications cellular base station including a power detector arrangement comprising a radio frequency coupler, a radio frequency to direct current voltage converter and an operational amplifier circuit to provide voltage scaling; wherein the operational amplifier circuit includes a plurality of amplifiers operable to amplify the dc signals, and wherein the plurality of amplifiers are sequentially independently operable over particular ranges, whereby the full range of operation of the detector is determined by the discrete ranges of operation of the plurality of amplifiers.

In accordance with a fourth aspect of the invention, there is provided a method of operating a telecommunications cellular base station including a power detector arrangement; which detector comprises a radio frequency coupler, a radio frequency to direct current voltage converter and an operational amplifier circuit to provide voltage scaling; wherein the operational amplifier circuit includes a plurality of amplifiers operable to amplify the dc signals, and wherein the plurality of amplifiers are sequentially independently operable over particular ranges, whereby the full range of operation of the detector is determined by the discrete ranges of operation of the plurality of amplifiers, the method comprising the steps of coupling rf energy, converting the rf energy to direct current voltage and outputting a signal of voltage Vrf to an amplification circuit, and operating the amplifier appropriate for the particular level of voltage.

In accordance with a fifth aspect of the invention, there is provided a radio frequency coupler, a radio frequency to direct current voltage converter and an operational amplifier circuit to provide voltage scaling; wherein the operational amplifier circuit includes a plurality of amplifiers operable to amplify the dc signals, and wherein the plurality of amplifiers are sequentially independently operable over particular ranges, whereby the full range of operation of the detector is determined by the discrete ranges of operation of the plurality of amplifiers.

In accordance with a sixth aspect of the invention, there is provided a method of operating a telecommunications system including a power detector arrangement; which detector comprises a radio frequency coupler, a radio frequency to direct current voltage converter and an operational amplifier circuit to provide voltage scaling; wherein the operational amplifier circuit includes a plurality of amplifiers operable to amplify the dc signals, and wherein the plurality of amplifiers are sequentially independently operable over particular ranges, whereby the full range of operation of the detector is determined by the discrete ranges of operation of the plurality of amplifiers, the method comprising the steps of coupling rf energy, converting the rf energy to direct current voltage and outputting a signal of voltage Vrf to an amplification circuit, and operating the amplifier appropriate for the particular level of voltage.

In accordance with a seventh aspect of the invention, there is provided a amplifier circuit operable to .provide voltage scaling; wherein the amplifier circuit includes a plurality of amplifiers operable to scale dc signals, and wherein the plurality of amplifiers are sequentially independently operable over particular ranges, whereby the full range of operation of the circuit is determined by the discrete ranges of operation of the plurality of amplifiers.

In accordance with a eighth aspect of the invention, there is provided a method of operating an amplifier circuit operable to provide voltage scaling; wherein the amplifier circuit includes a plurality of amplifiers operable to scale the dc signals, and wherein the plurality of amplifiers are sequentially independently operable over particular ranges, whereby the full range of operation of the circuit is determined by the discrete ranges of operation of the plurality of amplifiers, the method comprising the steps of inputting a signal of dc voltage to the amplification circuit, and operating the amplifier appropriate for the particular level of voltage.

The present invention thus provides apparatus and methods of switching amplifier or attenuator blocks.

BRIEF DESCRIPTION OF THE DRAWING

In order that the present invention can be more fully understood and to show how the same may be carried into effect, reference shall now be made, by way of example only, to the Figures as shown in the accompanying drawing sheets wherein.

DETAILED DESCRIPTION

There will now be described, by way of example, the best mode contemplated by the inventors for carrying out the invention. In the following description, numerous specific details are set out in order to provide a complete understanding of the present invention. It will be apparent, however, to those skilled in the art, that the present invention may be put into practice with variations of the specific.

Figure 1:
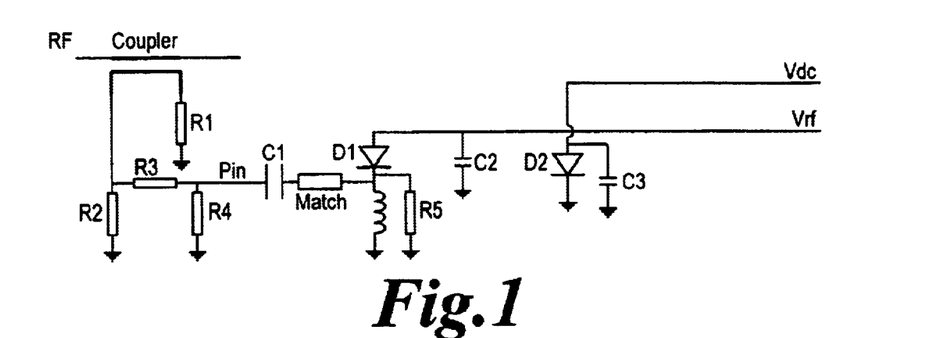
FIG. 1 shows a coupler and rf-dc conversion circuit of a power detector.
Figure 2:
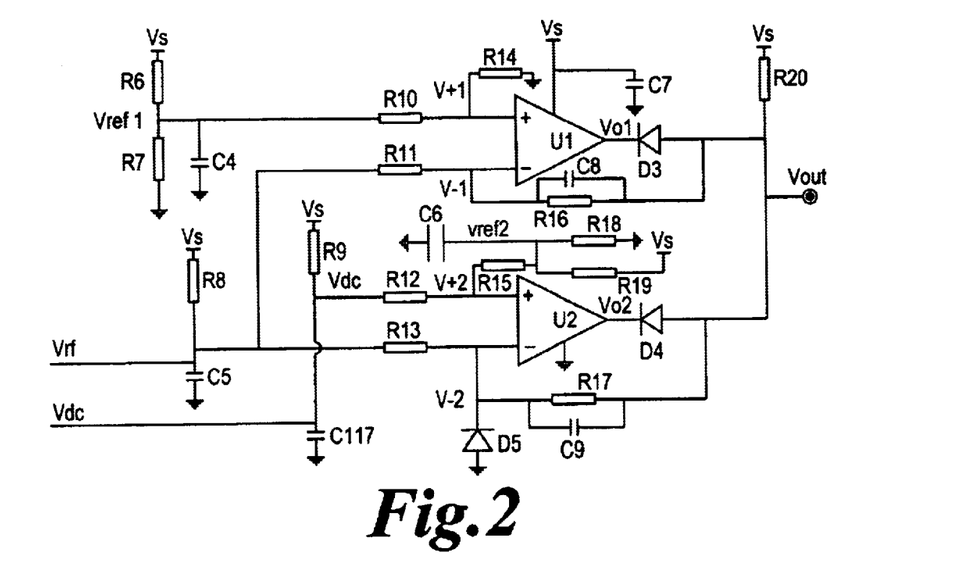
FIG. 2 shows an amplifier circuitry of a power detector.

FIGS. 1 and 2 show the coupler and amplifier circuitry associated with a power detector which couples energy such as rf energy from a transmission line feeding an antenna in a cellular communications base station. The output power detector uses a coupler to obtain a sample of the output power from the final amplifier stage of a power amplifier chain as used in high power applications. The sampled signal is then used to drive a diode detector, whose output is then scaled using an operational amplifier to provide a dc signal proportional to the rf power. This signal is then read by an analogue to digital converter, ADC. In addition the operational amplifier output is used in a power limiter control loop. The coupler employed in tests was a 30 dB coupler, using "end caps" to improve directivity. The coupled side is of 50 ohms impedance, although a higher impedance could be employed to increase the rf voltage for a given amount of coupled power, thus improving the sensitivity of the diode detector.

The operational amplifier takes the diode output voltage, Vrf, and scales it to a voltage range suitable for a further circuit, such as an ADC as per FIG. 2. In order to obtain a simply extended input power range, two operational amplifiers were used. Amplifier U2 is used for the low part of the range, and amplifier U1 is used for the high part of the range. The diodes D3 and D4 are used to automatically transfer from the low to the high range. Resistor R20 is employed to provide a sink current for the operational amplifiers.

The power detector circuit comprises a single diode detector, which can be of the Schottky type, using an additional diode to cancel the diode drop and provide temperature compensation, followed by an operational amplifier circuit to provide voltage scaling. A matching circuit provides frequency and temperature stability, as well as improving the minimum detectable power. The rf voltage is half wave rectified by the diode, and smoothed at its output by a capacitor. This detector is suitable to provide an input voltage Vrf to amplifiers such as the operational amplifier circuit shown in FIG. 2. The amplifier is used to transform the rf voltage detected by the diode into a form suitable for an analogue to digital converter (ADC) or similar device.

Figure 6:
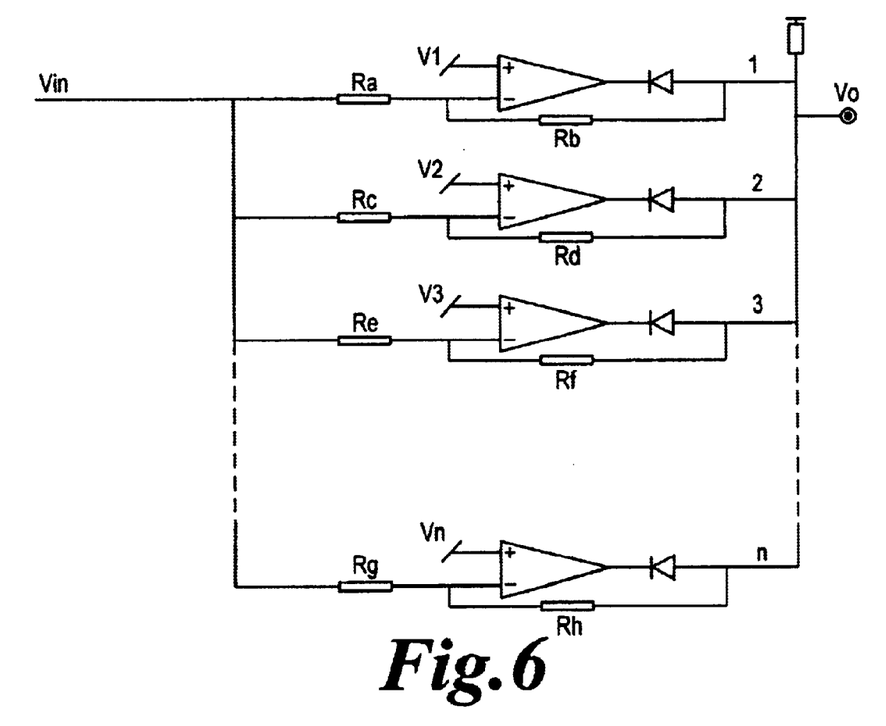
FIG. 6 shows an n-operational amplifier version of the circuit shown in FIG. 2.

In the embodiments shown, diodes in the operational amplifier feed back loops are used to automatically transfer from the low to the high range, although other types of switching control are possible. The switching operation of the amplifiers is similar to a wired OR connection used in digital electronics in that amplifiers U1 or U2 are switched. Automatic switching is achieved with the diodes contained in the operational amplifier feedback loops D3 and D4, in conjunction with appropriate values selected for the gain (R16/R11 and R17/R13, respectively for U1 and U2) and offset voltages V+1 and V+2 for the amplifiers. In FIG. 6 the values are determined by Rb/Ra and V1, Rd/Rc and V2 etc for the operational amplifiers.

The operational amplifier U2 in FIG. 2 is used for the low part of the range. This takes the voltages from the detector diode D1 and the temperature sensing diode D2. The output of U2 is proportional to the detected power, and temperature variations are cancelled by D2. The operational amplifier U1 in FIG. 2 is used for the high part of the range. Since the input power is now large relative to the quiescent bias power, there is little voltage variation with temperature on D1, and so no compensating diode is used.

The direct current (DC) signals Vdc and Vrf are generally passed to a differential amplifier which produces a voltage versus power response that is proportional to the ac signal power incident on D1, but is independent of temperature, due to the cancellation effect of D2.

For the circuits shown in FIGS. 1 and 2, it was observed that for high signal powers (>5 dBm) the voltage pn D1 (Vrf) was largely independent of temperature, and the temperature cancelling effect of D2 is not required. For this reason, U1 in FIG. 2 has a voltage V+1 which is independent of temperature, and is set by Vs, R6, R7, R10 and R14. Since temperature compensation was still required for low signal powers, U2 uses the temperature dependent voltage Vdc as one of its inputs.

Figure 3:
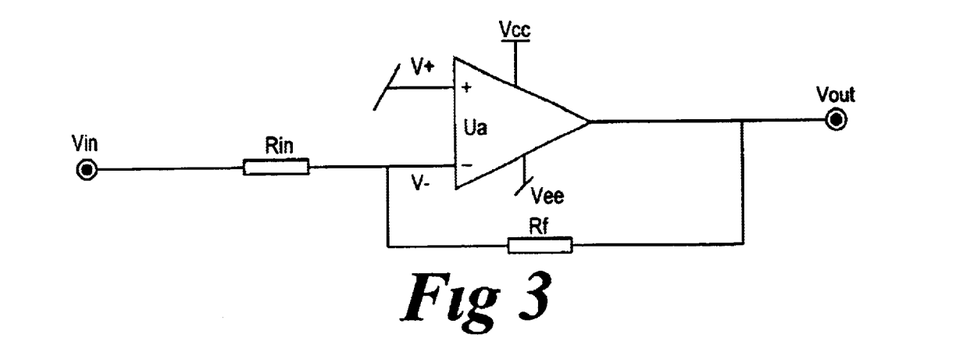
FIG. 3 shows a single inverting operational amplifier.

FIG. 3 provides a simple inverting amplifier circuit, with a standard inverting amplifier configuration. In general, Vcc is the positive supply, Vee is the negative supply, and V+ is 0 V. Due to operational amplifier (Ua) operation, V− will be (almost) the same as V+. The input current to Ua will be very small, and ideally zero.

Assuming:

$$V^- = V^+ = 0$$

$$I_{Rin} = I_{Rf}$$

Then:

$$I_{Rin} = \frac{(V^- - V_{in})}{R_{in}} = \frac{V_{in}}{R_{in}}$$

$$I_{Rf} = \frac{(V_{out} - V^-)}{R_f} = \frac{V_{out}}{R_f}$$

Hence:

$$\frac{V_{out}}{R_f} = -\frac{V_{in}}{R_{in}} \quad \text{Or:} \quad \frac{V_{out}}{V_{in}} = -\frac{R_f}{R_{in}}$$

The gain of the circuit is set by the values of Rin and Rf. Placing a diode in the feedback circuit does not fundamentally change this relationship.

Figure 4:
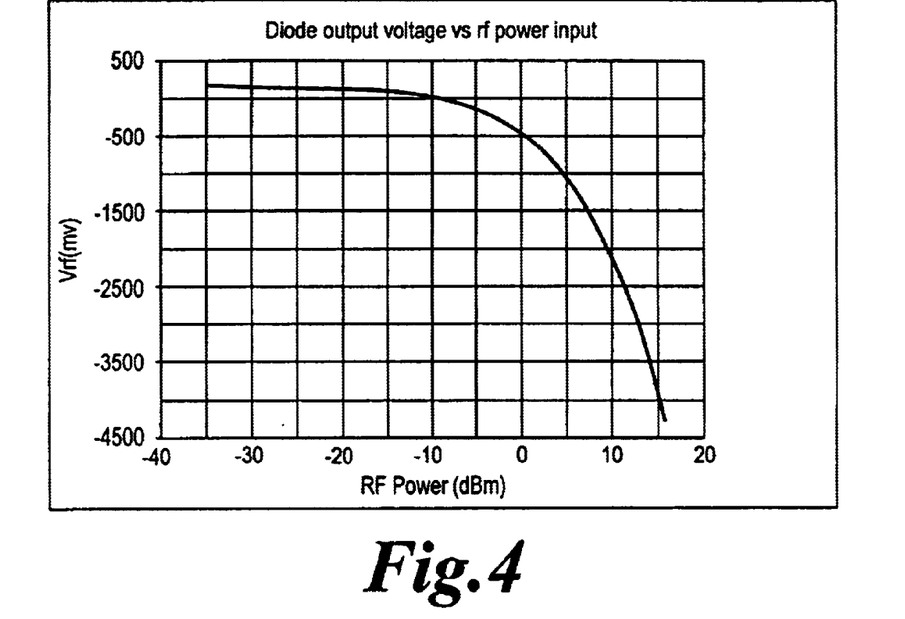
FIG. 4 is a graph showing measured diode output versus coupled rf input.

With reference to FIG. 1, the output voltage (Vrf) will respond to the rf input power obtained via the coupler in a logarithmic manner. FIG. 4 shows a measured response. It would be desirable to straighten out this response.

A simple approach would be to have two amplifiers, one having a high gain, and one having a low gain. The high gain amplifier could be used for the low power portion of the curve, and the low gain amplifier could be used for the high power portion of the curve. It is necessary to switch between the two amplifiers: this can be performed by a number of alternatives. The switching could be performed by a microprocessor or similar: when the output reaches a certain value then the circuit could be switched to a different amplifier. A problem with this switching system is that a hysteresis curve response would be present in the transition region between the operating ranges of the two amplifiers. Further, additional control and decision circuitry would be required. If the outputs of these two amplifiers were level shifted and combined, a composite response could be obtained. Although this response would not be a straight line, it would be an improvement on the diode response shown in FIG. 4.

Alternatively, switching could be performed using diode and gain control whereby the operation of the amplifier circuits are determined automatically and the input voltage to the circuit determines which diodes are reverse biased whereby only one amplifier is operable.

Thus the circuit of FIG. 2 comprises two amplifiers and the circuit automatically switches between the high gain amplifier (U2), and the low gain amplifier (U1). U2 is used for low power levels and U1 is used for high power levels.

Figure 5:
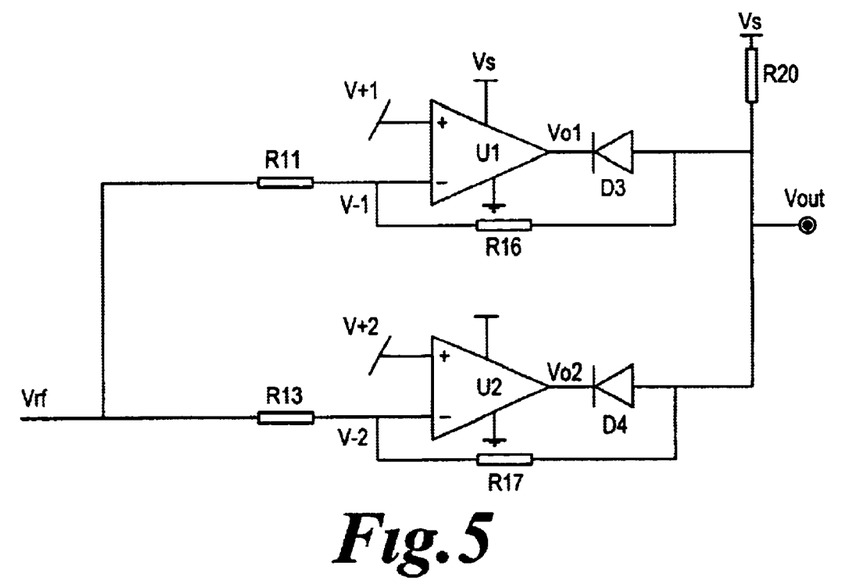
FIG. 5 shows a simplified version of the circuit shown in FIG. 2.

FIG. 5 is a simplified version of FIG. 2. A single rail supply is shown here, although a dual rail supply could be used. In addition, the response could be improved further by using more than two amplifiers. FIG. 6 shows an n-element amplifier circuit.

Returning to the circuit of FIG. 2:

$$\frac{R16}{R11} < \frac{R17}{R13}$$

$$V^{+1} < V^{+2}$$

Comparing FIG. 5 to FIG. 3, it can be seen that a diode has been introduced into the operational amplifier feedback path, and that resistor R20 has been added. The function of components R20, D3 and D4 is similar to a wired OR switch as used in digital electronics, although the action differs in many respects.

In a single supply application, V+2>0 V in order to overcome the forward voltage drop of D4.

To maintain a closed loop, the operational amplifier circuit must be able to source and sink current. Since there is a diode in the circuit, the operational amplifier feedback circuit will go open-loop if it tries to source current since only leakage current can pass in the reverse direction of the diode.

For a given Vrf, U1 will try to set Vo1 to a value depending on Vrf, V+1, R11, R16, R20 and D3 (the parallel effect of R13 and R17 is not considered here). Similarly, U2 will try to set Vo2 to a value depending on Vrf, V+2, R13, R17, R20 and D4.

Consider the case when Vo2<Vo1. U2 will sink current through R20 via the forward biased diode D4. If D3 and D4 are identical, then D3 will be reverse biased since the output voltage (Vout) will be the lower of (vo2+Vd4) and (Vo1+Vd3), i.e. to forward bias D3, we require Vout=Vo1+Vd3, but we have Vout=Vo2+Vd4, which is less than Vo1+Vd3, and hence D3 is not forward biased. As a result we have the situation where U2 is sinking current and is able to maintain closed loop operation, hence it is able to maintain Vout based on component values and Vrf. Conversely, U1 tries to source current in order to set vout, however D3 prevents this (only a very small leakage current will flow), and U1 drives Vo1 to the positive supply rail.

The situation is similar when Vo2>Vo1.

Figure 10:
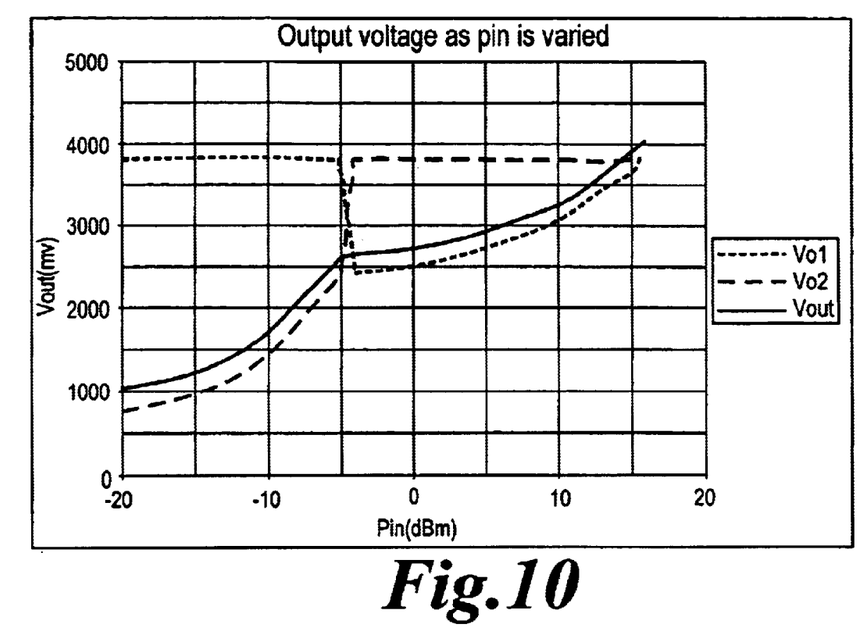
FIG. 10 is a graph of the variation of output voltage as Pin is varied (measured)
Figure 11:
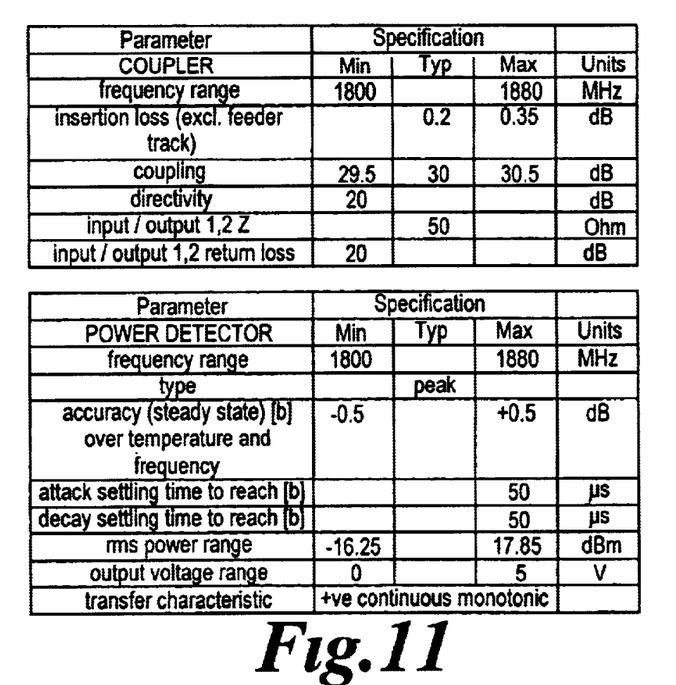
FIG. 11 is a table which lists the performance criteria as per GSM for a power amplifier arrangement.

In the situation when Vo1 is approximately the same as Vo2, we have a very fast crossover region due to the high open loop gain of the operational amplifiers. FIG. 10 shows measured results for Vo1, Vo2 and Vout as a function of Pin (Vrf is proportional to Pin, see FIG. 4).

With reference to FIG. 10, Vout is greater than Vo2 (low power region) and Vo1 (high power region) by reason of a voltage drop across the diode, which in this case was approximately 0.2 V since Schottky diodes are present in the operational amplifier feedback path. It is possible to use alternative types of diode in the feedback path. When U1 is open loop, Vo1 is less than the supply voltage of 5 V due to limitations of the operational amplifier used, the situation being the same for U2 and Vo2 in this application.

The principle can be extended to n amplifiers as shown in FIG. 6. Switching occurs automatically, and is dependent on Vin, and Ra, Rb, Rc, . . . Rn and V1, V2, V3, . . . Vn. When a particular amplifier is enabled, the output voltage Vo is not only a function of the gain setting resistors, but also the voltage present on the + input of the amplifier (i.e. V1, V2, V3, . . . Vn), and these voltages can be constant or variable (e.g. temperature, supply voltage, humidity, etc., dependent) or a combination of different types of voltage sources.

If it was required to switch the amplifiers under the control of, for example, a microcontroller, then the diodes could be replaced by switches. Closing a switch would enable an amplifier block and opening a switch would disable an amplifier block.

Figure 7:
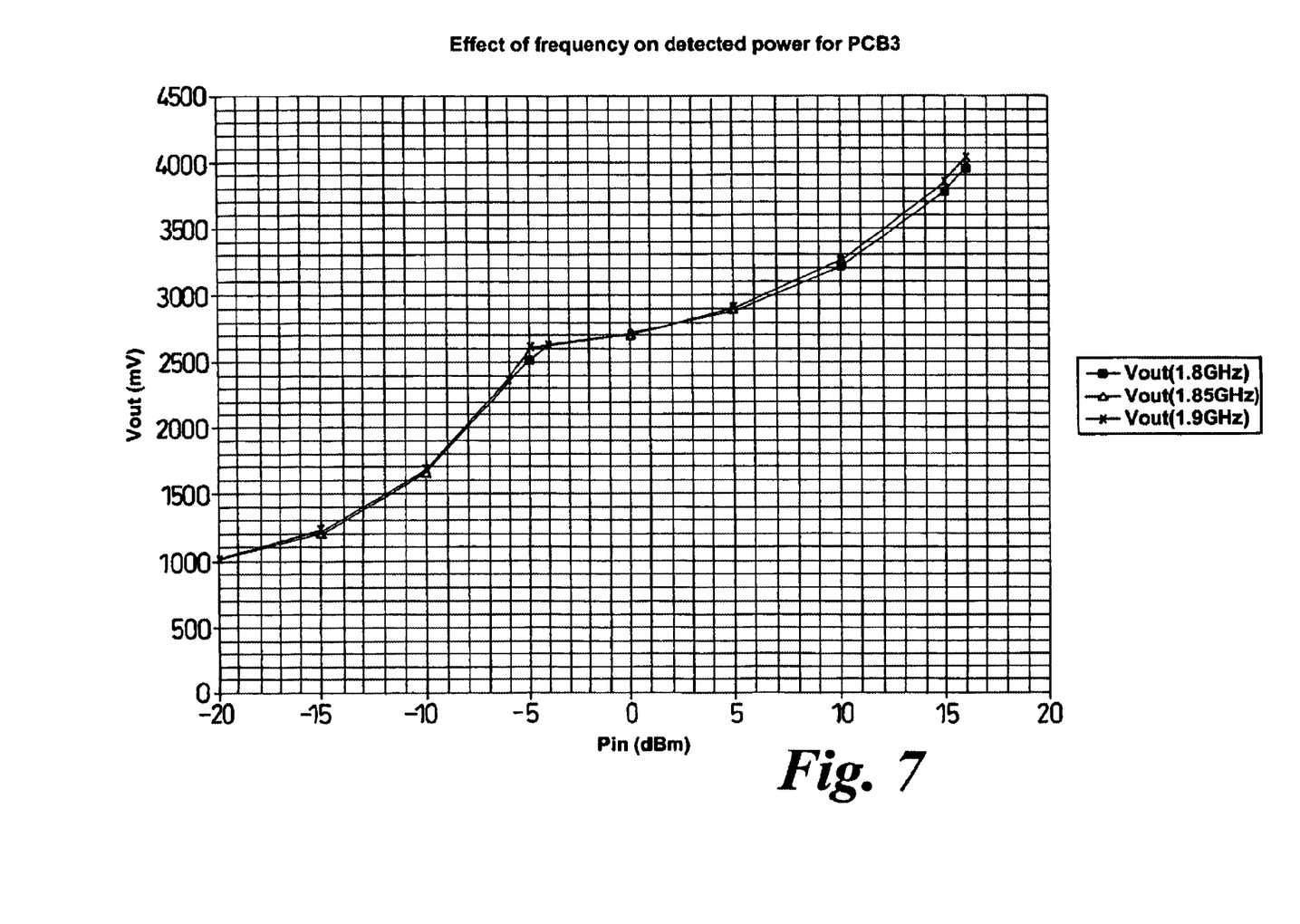
FIG. 7 shows the effect of, frequency on vout (measured)

FIG. 7 provides a graphical representation of frequency variation with respect to Vout (mV) for given power inputs (dBm). This was obtained at room temperature. Variations with frequency are partly due to the matching of the detector diode in FIG. 1. For a detector output of 3.5 V, the uncertainty is approximately 0.5 dB. This uncertainty may be partly due to the input match at 1.8 GHz (17 dB) being different from that at 1.85 GHz (25 dB) and 1.9 GHz (25 dB) for pcb 2gpa023(003).

Figure 8:
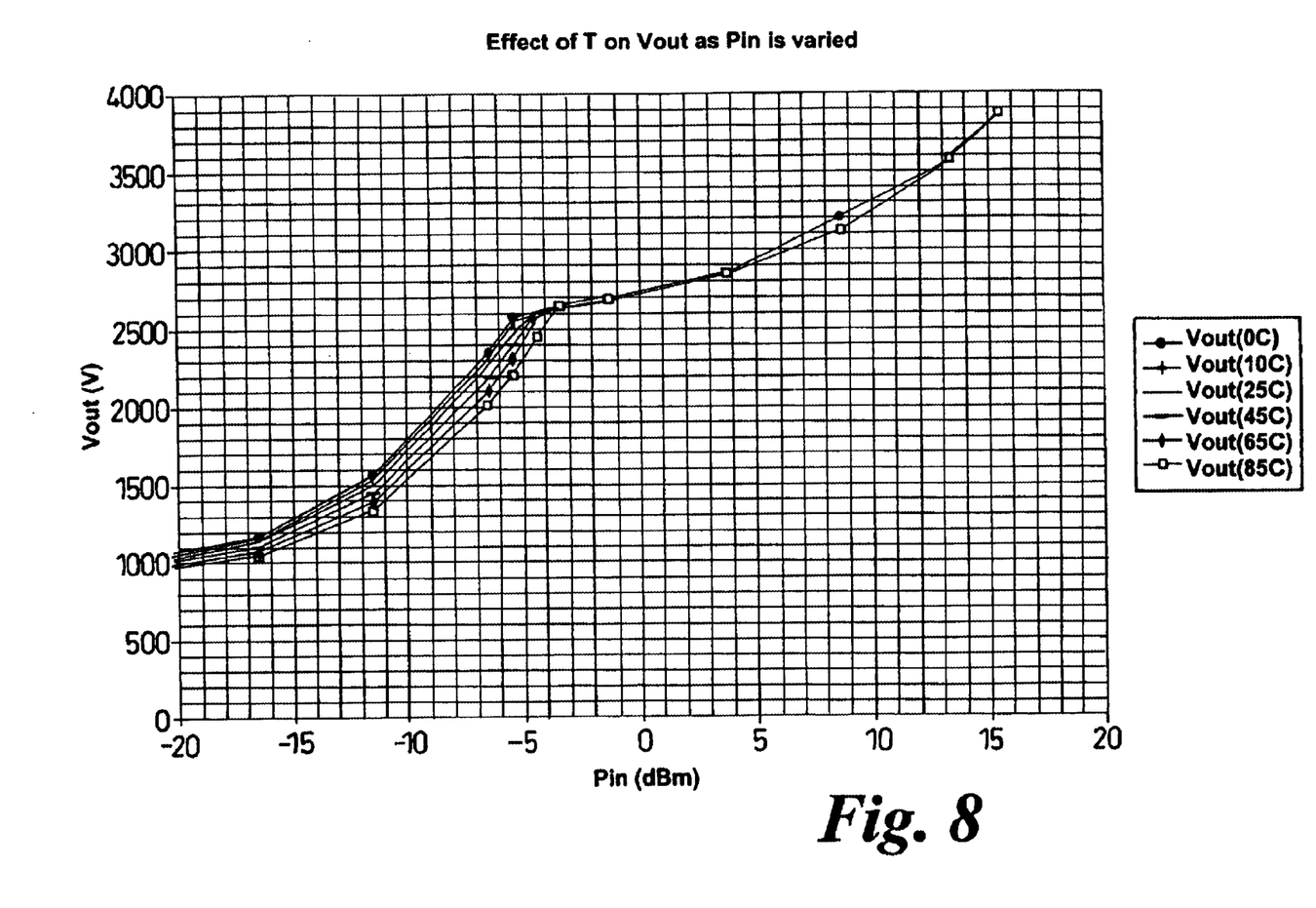
FIG. 8 shows the effect of temperature on vout (measured)

FIG. 8 is a graph of the effect of temperature on Vout. It can be seen that the output is reasonably stable with temperature from 0 to 15 dBm input power. This corresponds to the 'high range' U1 circuitry (FIG. 2). From −20 dBm to −4 dBm, the output varies significantly with temperature. The use of diode D2 can be of some assistance in negating the effect of temperature on the diode D1. The figure shows that the output power varies by approximately 0.7 dB for an input power of 0 dBm, and improves to approximately 0.2 dB for an input power of 15 dBm. This can meet the required specification for some telecommunications operating specifications in the high range. The effect of temperature on frequency variation may cause a problem if the input match is adversely affected by temperature. If this does prove to be a problem, it can be overcome with an alternative matching topology or refinement of the circuitry associated with diode D2.

Figure 9:
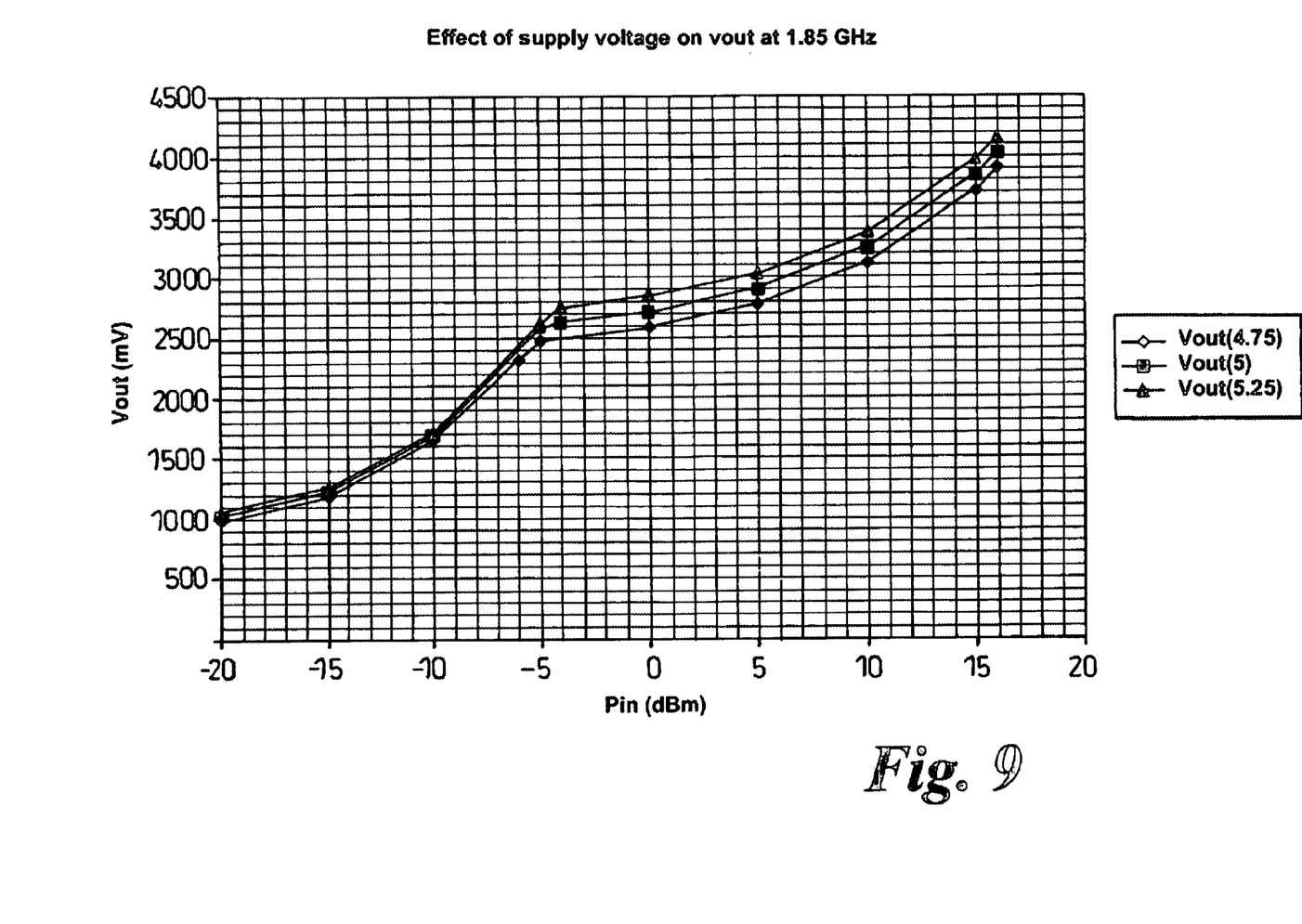
FIG. 9 shows the effect of supply voltage on vout (measured)

FIG. 9 is a graph of the effect of supply voltage on vout. The 'high range' U1 circuitry (FIG. 2) varies significantly with supply voltage. This is most likely due to the reference on the V+ input. The use of a high tolerance stabilized power supply is advised to reduce the possibility of an untoward variation in Vout (FIG. 2). It is also preferable to employ a voltage reference to derive V+1.

Figure 12:
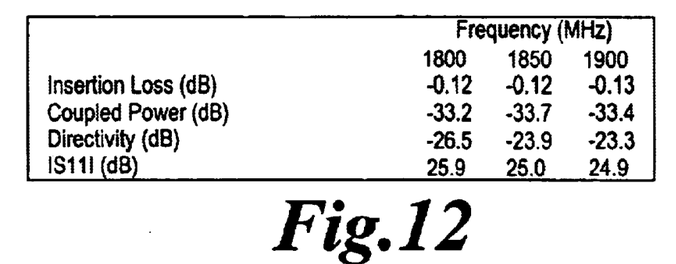
FIG. 12 is a table which shows the S-parameter data for a coupler made in accordance with the present invention.
Figure 13:
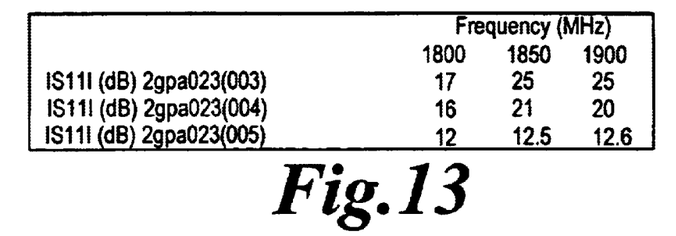
FIG. 13 is a table which shows the S11 performance (measured) for a power detector made in accordance with the present invention for three different matched topologies.
Figure 14:
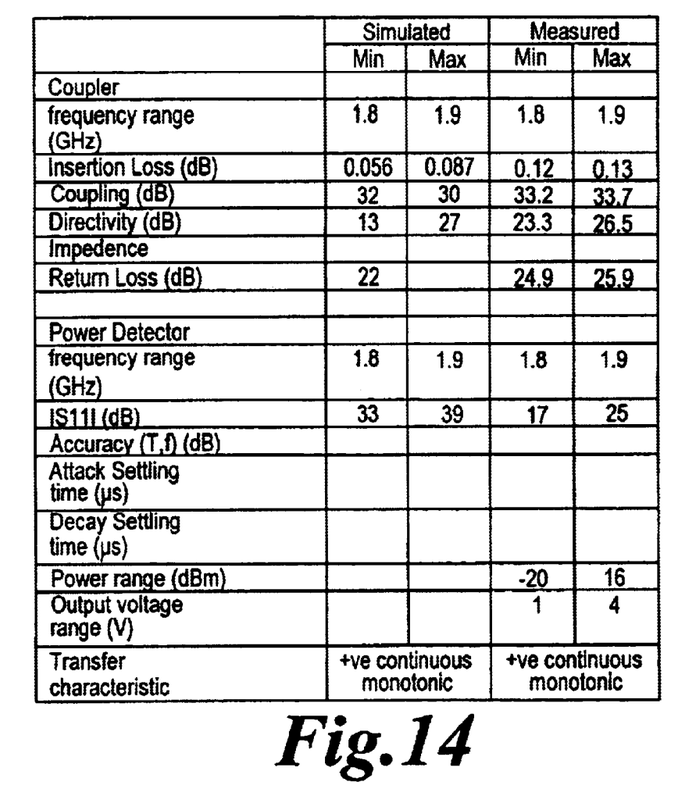
FIG. 14 provides a comparison table of simulated versus measured performance of a coupler and a power detector made in accordance with the present invention.
Figure 15:
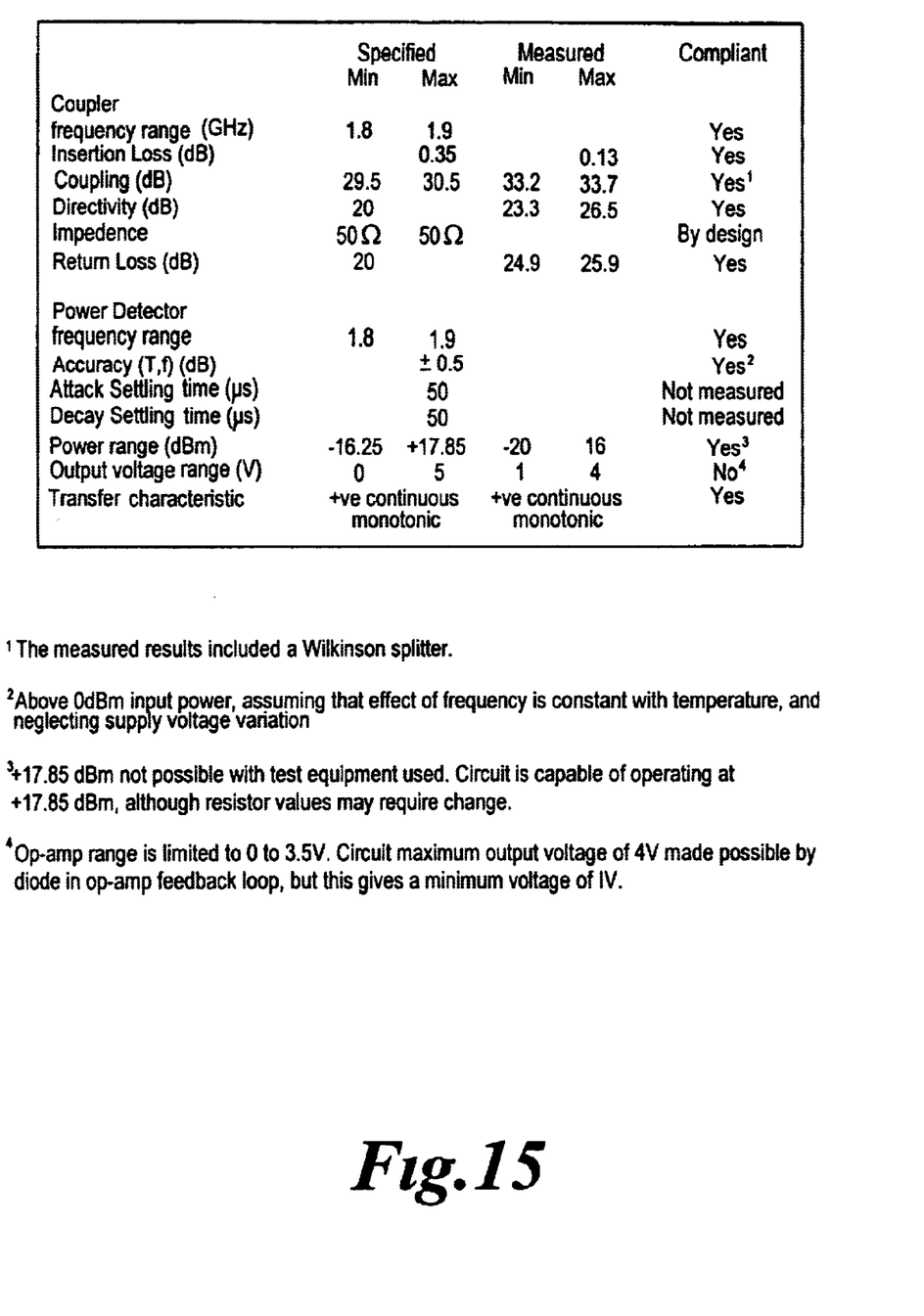
FIG. 15 provides a compliance table for the coupler and power detector with respect to the GSM requirements for a power amplifier arrangement.

The performance of both the coupler and the power detector were determined and the results (at room temperature) are shown in FIGS. 12 and 13 respectively. The results shown in FIG. 12 include the effects of a Wilkinson splitter. Such a coupler is not strictly necessary and where the coupler is not present, the coupled power will be 3 to 4 dB higher than that shown. In FIG. 13, the return losses for three different input matching circuits are shown. The measured input impedance of the diode was found to be slightly different to the simulated input impedance and the input matching circuits had to be tuned to achieve the above values.

The resolution required in the specification of some telecommunications operating systems can be as high as 0.125 dB per ADC bit (the ADC range is $(2^8-1) \cdot 0.125 = 31.875$ dB). This resolution is only possible for a linear input to the ADC, and shallow parts of the graphical response of the detector presented here will give worse than 0.125 dB resolution (possibly 1 dB). Conversely steeper parts of the graphical response will give better resolution.

Whilst the response obtained is not linear it is a great deal more linear than a logarithmic response. The circuit allows reduced system complexity, and the circuit itself is reasonably simple. The exemplary power detector design has been developed for use in, inter alia, the design of a cellular radio base station power amplifier. The reduced complexity of the digital control section, requires few components, is relatively cheap. The detector diode can be provided on a separate pcb, with a minimum number of interconnects, whereby manufacturing, assembly and maintenance may be simplified.

What is claimed is:

1. A radio frequency power detector, which detector comprises a radio frequency coupler, a radio frequency to direct current voltage converter and an operational amplifier circuit to provide voltage scaling;

wherein the operational amplifier circuit includes a plurality of amplifiers operable to amplify the dc signals, and wherein the plurality of amplifiers are sequentially independently operable over particular power ranges, whereby the full range of operation of the detector is determined by the discrete ranges of operation of the plurality of amplifiers.

2. A radio frequency power detector according to claim 1, wherein the amplifiers are switched into operation by means of diodes which are brought into operation depending upon the gain and offset voltages for the respective amplifiers within the amplification circuitry.

3. A radio frequency power detector according to claim 1, wherein the amplifiers are switched into operation under microprocessor control.

4. A radio frequency power detector according to claim 1, wherein the radio frequency to direct current voltage converter is a diode detector.

5. A radio frequency power detector according to claim 1, wherein, the radio frequency to direct current voltage converter is a Schottky diode detector.

6. A radio frequency power detector according to claim 1, wherein the radio frequency to direct current voltage converter is a diode detector and the diode detector has an additional diode to cancel the voltage drop occurring through the diode.

7. A method of operating a radio frequency power detector, which detector comprises a radio frequency coupler, a radio frequency to direct current voltage converter and an operational amplifier circuit to provide voltage scaling;

wherein the operational amplifier circuit includes a plurality of amplifiers operable to amplify the dc signals, and wherein the plurality of amplifiers are sequentially independently operable over particular power ranges, whereby the full range of operation of the detector is determined by the discrete ranges of operation of the plurality of amplifiers, the method comprising the steps of coupling rf energy, converting the rf energy to direct current voltage and outputting a signal of voltage Vrf to an amplification circuit, and operating the amplifier appropriate for the particular level of voltage.

8. A method of operating a radio frequency power detector according to claim 7, wherein the amplifiers are switched into operation by means of diodes which are brought into operation depending upon the gain and offset voltages for the respective amplifiers within the amplification circuitry.

9. A radio frequency power detector according to claim 7, wherein the amplifiers are switched into operation under microprocessor control.

10. A radio frequency power detector according to claim 7, wherein the radio frequency to direct current voltage converter is a diode detector.

11. A radio frequency power detector according to claim 7, wherein, the radio frequency to direct current voltage converter is a Schottky diode detector.

12. A radio frequency power detector according to claim 7, wherein the radio frequency to direct current voltage converter is a diode detector and the diode detector has an additional diode to cancel the voltage drop occurring through the diode.

13. A telecommunications cellular base station including a power detector arrangement comprising a radio frequency coupler, a radio frequency to direct current voltage converter and an operational amplifier circuit to provide voltage scaling;

wherein the operational amplifier circuit includes a plurality of amplifiers operable to amplify the dc signals, and wherein the plurality of amplifiers are sequentially independently operable over particular power ranges, whereby the full range of operation of the detector is determined by the discrete ranges of operation of the plurality of amplifiers.

14. A method of operating a telecommunications cellular base station including a power detector arrangement; which detector comprises a radio frequency coupler, a radio frequency to direct current voltage converter and an operational amplifier circuit to provide voltage scaling;

wherein the operational amplifier circuit includes a plurality of amplifiers operable to amplify the dc signals, and wherein the plurality of amplifiers are sequentially independently operable over particular power ranges, whereby the full range of operation of the detector is determined by the discrete ranges of operation of the plurality of amplifiers, the method comprising the steps of coupling rf energy, converting the rf energy to direct current voltage and outputting a signal of voltage Vrf to an amplification circuit, and operating the amplifier appropriate for the particular level of voltage.

15. A telecommunications system including a power detector arrangement comprising a radio frequency coupler, a radio frequency to direct current voltage converter and an operational amplifier circuit to provide voltage scaling;

wherein the operational amplifier circuit includes a plurality of amplifiers operable to amplify the dc signals, and wherein the plurality of amplifiers are sequentially independently operable over particular power ranges, whereby the full range of operation of the detector is determined by the discrete ranges of operation of the plurality of amplifiers.

16. A method of operating a telecommunications system including a power detector arrangement; which detector comprises a radio frequency coupler, a radio frequency to direct current voltage converter and an operational amplifier circuit to provide voltage scaling;

wherein the operational amplifier circuit includes a plurality of amplifiers operable to amplify the dc signals, and wherein the plurality of amplifiers are sequentially independently operable over particular power ranges, whereby the full range of operation of the detector is determined by the discrete ranges of operation of the plurality of amplifiers, the method comprising the steps of coupling rf energy, converting the rf energy to direct current voltage and outputting a signal of voltage Vrf to an amplification circuit, and operating the amplifier appropriate for the particular level of voltage.

* * * * *